United States Patent
Gutsche et al.

(10) Patent No.: US 7,122,423 B2
(45) Date of Patent: Oct. 17, 2006

(54) METHOD FOR FABRICATING A MEMORY CELL

(75) Inventors: Martin Gutsche, Dorfen (DE); Harald Seidl, Poering (DE)

(73) Assignee: Infineon Technologies AG, Munich (DE)

(*) Notice: Subject to any disclaimer, the term of this patent is extended or adjusted under 35 U.S.C. 154(b) by 3 days.

(21) Appl. No.: 11/055,431

(22) Filed: Feb. 10, 2005

(65) Prior Publication Data
US 2005/0191806 A1 Sep. 1, 2005

(30) Foreign Application Priority Data
Feb. 16, 2004 (DE) .................. 10 2004 007 410

(51) Int. Cl.
*H01L 21/8242* (2006.01)
(52) U.S. Cl. .................. 438/243; 438/246; 438/386
(58) Field of Classification Search ........ 438/243–249, 438/386–392
See application file for complete search history.

(56) References Cited

U.S. PATENT DOCUMENTS 6,319,787 B1  11/2001 Enders et al.
7,056,832 B1 *  6/2006 Chang et al. ............... 438/725
2002/0167405 A1  11/2002 Short

FOREIGN PATENT DOCUMENTS

DE  199 29 859 A1   4/2000
DE  102 20 129 A1  11/2002

* cited by examiner

*Primary Examiner*—H. Jey Tsai
(74) *Attorney, Agent, or Firm*—Jenkins, Wilson, Taylor & Hunt, P.A.

(57) ABSTRACT

The invention provides a method for fabricating a memory cell for storing electric charge, which has a substrate (101), which forms a first electrode, a trench-like recess (102) etched into the substrate (101), conductive material, which is provided as a projection in a central region of the trench-like recess (102) and spaced apart from the side walls (107) of the trench-like recess (102) and is in electrical contact with the substrate at the base (104) of the trench-like recess (102), a dielectric layer (108), which has been deposited on the side walls (107) of the trench-like recess (102), the base (104) of the trench-like recess (102) and the surfaces of the conductive material (105), and an electrode layer (110), which has been deposited on the dielectric layer (108) and forms a second electrode.

9 Claims, 6 Drawing Sheets

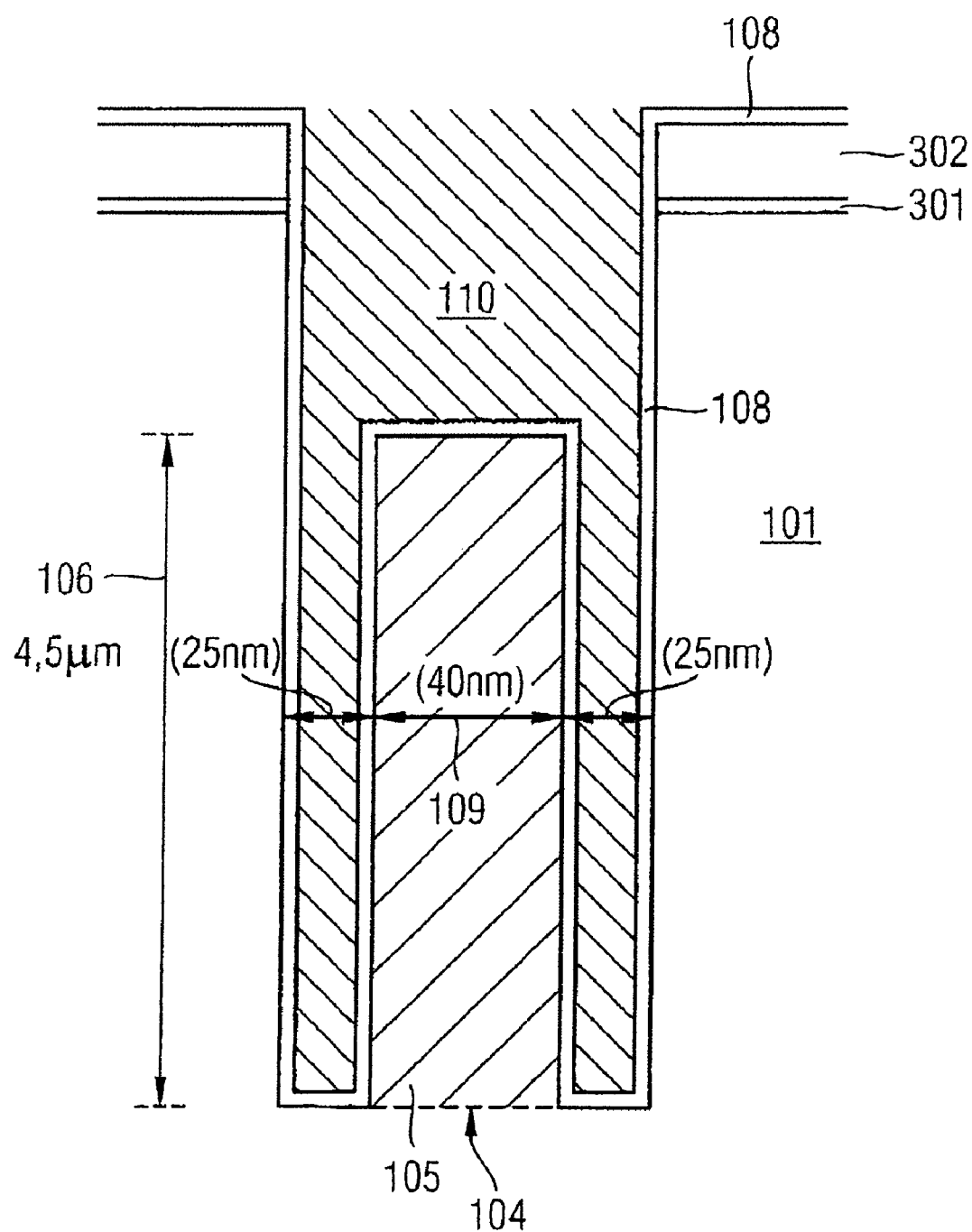

METHOD FOR FABRICATING A MEMORY CELL

TECHNICAL FIELD

The present invention relates in general terms to methods for fabricating memory cells which comprise a storage capacitor and a select transistor, which connects the storage electrode to a bit line. The present invention relates in particular to a method for fabricating a memory cell, in which the storage capacitor is designed as a trench capacitor, the storage cell, to store electric charge, comprising a substrate, which forms a first electrode, a trench-like recess etched into the substrate, a dielectric layer, which has been deposited at the side walls of the trench-like recess, and an electrode layer, which has been deposited on the dielectric layer and forms a second electrode.

BACKGROUND ART

What are known as single-transistor cells are used in dynamic random access memories. To further increase the storage density for future technology generations, the feature size is reduced from generation to generation. This leads to a reduced surface area of the storage capacitor of the memory cell, with the result that the capacitance of the capacitor is reduced accordingly. For this reason, it is necessary for the capacitance of the capacitor to remain at least constant despite the reduced feature size.

To solve this problem, it has been proposed to etch deeper trench-like structures (deep trenches). However, limits are disadvantageously imposed on the extent to which the capacitance of the capacitor can be increased in this way, since an anisotropic etching process cannot provide structures of any desired depth and with any desired aspect ratio.

Furthermore, it has been proposed to introduce what are known as grain elements or hemispherical silicon grains HSG in a lower region of the trench-like recess in order to increase the first electrode surface area. However, an increase in the surface area by the introduction of grain elements is disadvantageously associated with a considerable outlay on technology, which leads to an increase in costs during the fabrication of memory cells.

Furthermore, it has also been proposed to widen the trench-like recess in a lower region of the trench, for example by means of a side wall etch, in order to increase the surface area of a storage capacitor which forms a memory cell. However, the amount of additional capacitor surface area which can be achieved by a side wall etch (bottle etch) is limited.

SUMMARY OF THE INVENTION

Therefore, it is an object of the present invention to provide a memory cell in which an electrode surface area and therefore a capacitor capacitance of the memory cell are considerably increased, as well as a method for fabricating the memory cell.

According to the invention, this object is achieved by a method described in Patent claim 1.

Furthermore, this object is achieved by a memory cell having the features of Patent claim 1.

Further configurations of the invention will emerge from the subclaims.

One main idea of the invention consists in increasing a surface area of a first and a second electrode of a capacitor which forms the memory cell by folding the capacitor structure upward within a trench-like recess, with a conductive material being provided as a projection in a central region of the trench-like recess, spaced apart from the side walls of the trench-like recess.

A particular advantage of the method according to the invention for fabricating a memory cell is that it can be combined with the side wall etch method used to increase the surface area of at least one capacitor electrode.

The method according to the invention for fabricating a memory cell substantially comprises the steps of:

a) etching a trench-like recess into a substrate;

b) depositing a first protective layer at the inner surfaces of the trench-like recess;

c) anisotropically etching the first protective layer, in such a manner that the first protective layer is removed at the base of the trench-like recess but is retained at the side walls of the trench-like recess;

d) filling the trench-like recess with an electrically conductive material in such a manner that an electrical contact is provided between the electrically conductive material and the substrate;

e) isotropically etching back the conductive material to a predetermined filling height;

f) removing the first protective layer in such a manner that the conductive material is retained as a projection in the trench-like recess, spaced apart from the side walls of the trench-like recess;

g) depositing a dielectric layer on the side walls of the trench-like recess, the base of the trench-like recess and the surfaces of the conductive material; and h) depositing an electrode layer on the dielectric layer.

Furthermore, the memory cell according to the invention for storing electric charge substantially includes:

a) a substrate, which forms a first electrode;

b) a trench-like recess, which is etched into the substrate;

c) a conductive material, which is provided as a projection in a central region of the trench-like recess, spaced apart from the side walls of the trench-like recess, is in electrical contact with the substrate at the base of the trench-like recess and has been etched back to a predetermined filling height;

d) a dielectric layer, which has been deposited on the side walls of the trench-like recess, the base of the trench-like recess and the surfaces of the conductive material; and e) an electrode layer which has been deposited on the dielectric layer and forms a second electrode of the memory cell.

The subclaims give advantageous refinements and improvements to the respective subject matter of the invention.

According to a preferred refinement of the present invention, prior to the step of depositing a dielectric layer, a second protective layer is deposited nonconformally in an upper region of the trench-like recess, an embedded electrode is produced by means of gas phase doping in the trench-like recess, and the second protective layer is removed again by wet-chemical means. It is preferable for nonconformal deposition of the second protective layer of this nature to be carried out by means of an ALD process.

It is expedient for both the trench-like recess that is already present and the substrate to be protected by the second protective layer during subsequent process steps.

According to a further preferred refinement of the present invention, the dielectric layer is deposited on the side walls of the trench-like recess, the base of the trench-like recess and the surfaces of the conductive material by means of atomic layer deposition (ALD). It is preferable for the dielectric layer to be annealed after it has been deposited.

According to yet another preferred refinement of the present invention, the trench-like recess is widened in a lower region by means of a side wall etch, preferably using a bottle etch process. This increases the useable storage capacitor electrode surface area.

According to yet another preferred refinement of the present invention, the first protective layer is provided as a sacrificial layer of a carbon material. The carbon material in particular has the advantage of being easy to remove, so that the first protective layer can be removed in a simple way after application of the conductive material. The second protective layer is preferably formed from an aluminum oxide material ($Al_2O_3$). In particular, it is expedient that the removal of the first protective layer is carried out selectively with respect to silicon nitride (SiN) and silicon oxide ($SiO_2$), in such a manner that the conductive material is retained as a projection in the trench-like recess, spaced apart from the side walls of the trench-like recess. Furthermore, it is expedient that the removal of the first protective layer can be carried out by dry-chemical means, by means of an isotropic etch and/or by means of an anisotropic etch.

According to yet another preferred refinement of the present invention, during a deposition of the electrode layer on the dielectric layer the space which remains in the trench-like recess is completely filled.

According to yet another preferred refinement of the present invention, the substrate which forms the first electrode is formed from silicon in single-crystal form. Furthermore, it is advantageous if the electrode layer which forms the second electrode is formed from doped polycrystalline silicon or titanium nitride. Alternatively, metal nitrides, metal silicides, metal-silicon nitrides, metal-aluminum nitrides, metal-carbon nitrides, metal-aluminum-silicon nitrides, aluminum-silicon-carbon nitrides or the like are also suitable.

According to yet another preferred refinement of the present invention, the dielectric layer which has been deposited on the side walls of the trench-like recess, the base of the trench-like recess and the surfaces of the conductive material is formed from an aluminum oxide material ($Al_2O_3$). Alternatively, hafnium oxide, rare earth oxides, metal-aluminum oxynitrides, metal oxynitrides, metal-silicon oxynitrides or the like are also suitable.

It is preferable for the conductive material which is provided in the form of a projection in a central region of the trench-like recess and spaced apart from the side walls of the trench-like recess to consist of silicon.

Exemplary embodiments of the invention are illustrated in the drawings and explained in more detail in the description which follows.

BRIEF DESCRIPTION OF THE DRAWINGS

FIG. 6 shows the arrangement shown in FIG. 5, with an electrode layer having been deposited on the dielectric layer.

DETAILED DESCRIPTION OF THE INVENTION

In the figures, identical reference symbols denote identical or functionally equivalent components or steps.

The following text provides an explanation of the method according to the invention for fabricating a memory cell on the basis of main process steps, which are shown in FIGS. 1 to 6.

Figure 1:
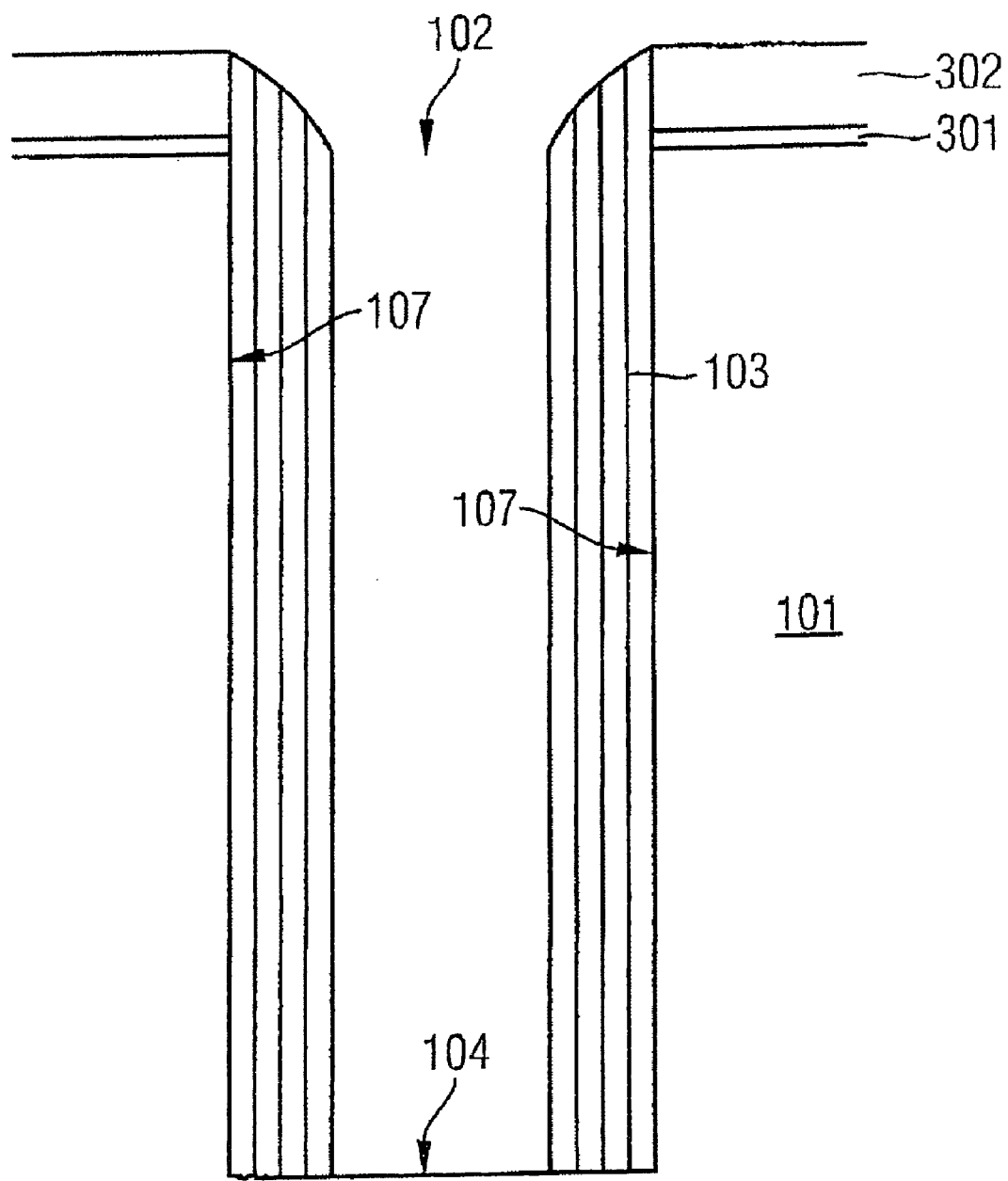
FIG. 1 shows a trench-like recess which has been etched into a substrate, with the side walls of the trench-like recess covered with a first protective layer.

FIG. 1 shows a substrate 101, into which a trench-like recess 102 has been etched. The trench-like recess 102 has side walls 107 and a base 104. It is preferable for the substrate 101 to consist of silicon in single-crystal or polycrystalline form. Electrical contact with the substrate 101 is made possible specifically via the base 104 of the trench-like recess 102.

In FIG. 1, a first protective layer 103, which consists, for example, of a carbon material, has been deposited at the side walls 107 of the trench-like recess. Deposition of this nature is carried out, for example, by means of a chemical vapor deposition process (CVD). Deposition of this type takes place conformally on all the internal surfaces of the trench-like recess 102, i.e. at the side walls 107 of the trench-like recess 102 and on the base 104 of the trench-like recess 102.

Finally, in a further process step (not shown in FIG. 1), the first protective layer 103 is etched anisotropically in such a manner that the first protective layer 103 is removed at the base 104 of the trench-like recess 102 but is retained at the side walls 107 of the trench-like recess 102. It is in this way possible to obtain electrical contact with the substrate 101 via the base 104 of the trench-like recess 102.

Figure 2:
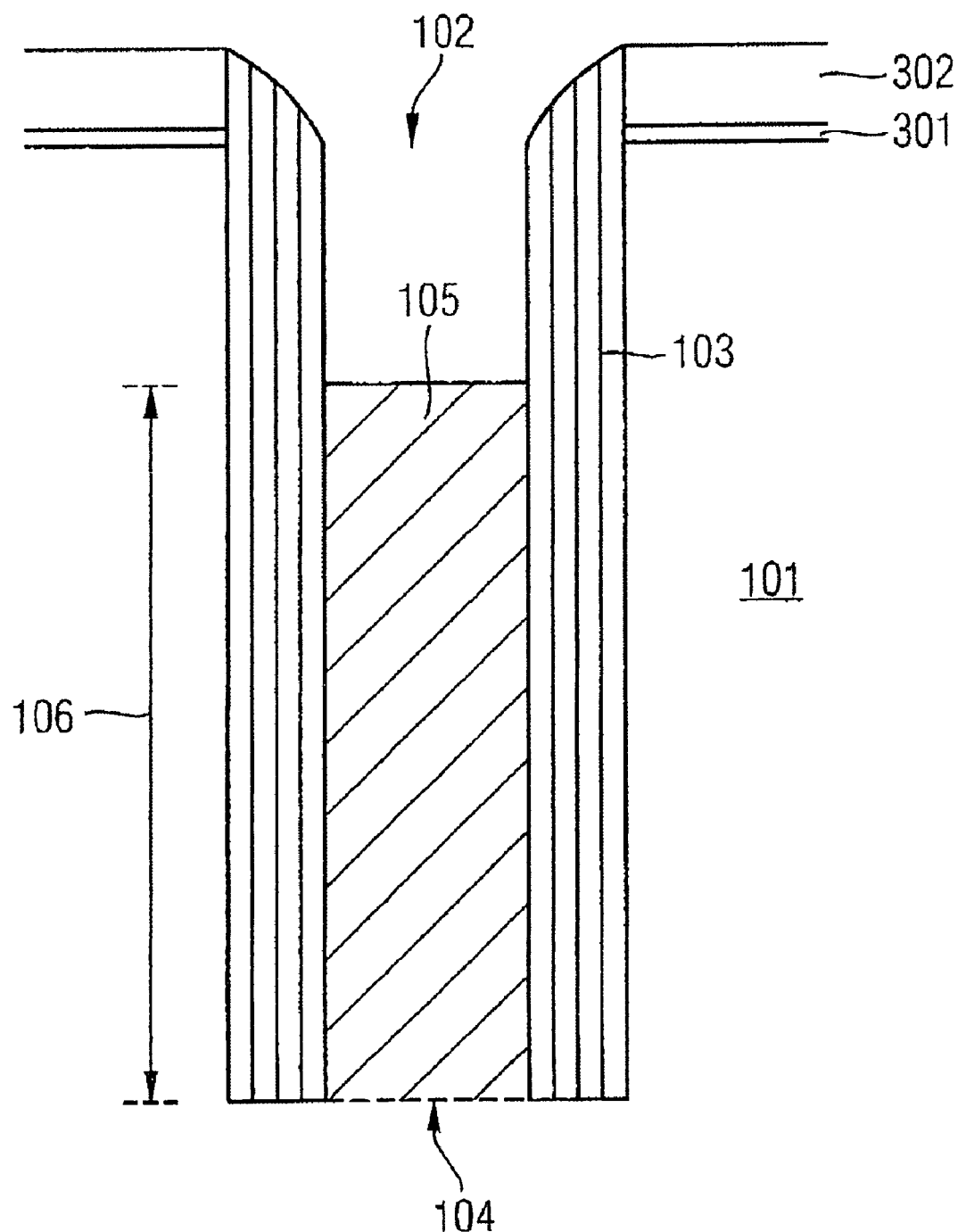
FIG. 2 shows the arrangement shown in FIG. 1, with the interior of the trench-like recess which remains having been partially filled with a conductive material.

FIG. 2 shows the arrangement shown in FIG. 1 after a further process step has been carried out, i.e. after the trench-like recess 102 has been filled with an electrically conductive material 105 in such a manner that an electrical contact is produced between the electrically conductive material 105 and the substrate 101. The electrically conductive material 105 preferably consists of a polysilicon material, with a polysilicon etchback being provided for (not shown in FIG. 2). FIG. 2 illustrates the conductive material 105 in the trench-like recess 102 of the substrate 101 after it has already been etched back to a filling height 106.

Figure 3:
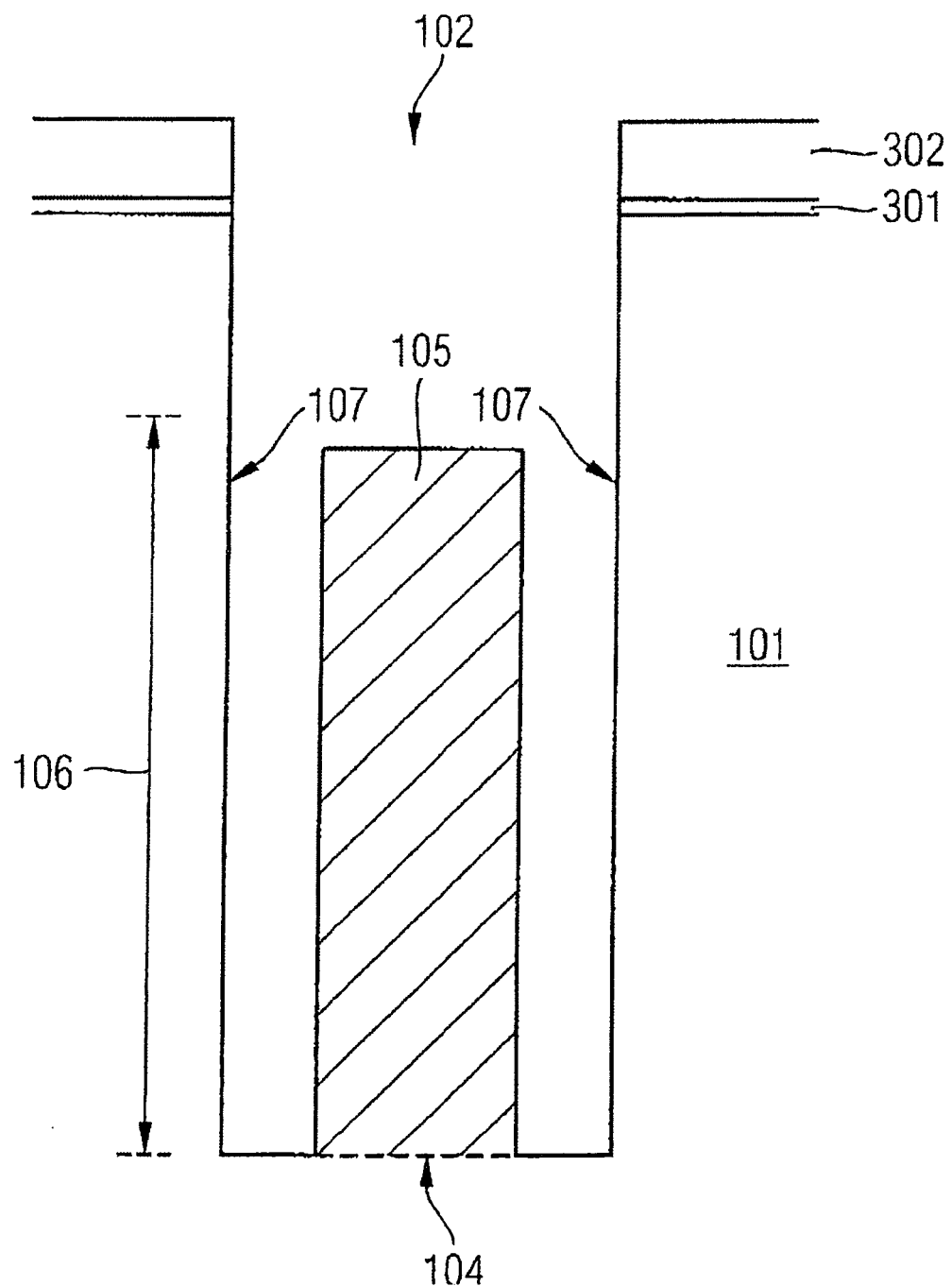
FIG. 3 shows the arrangement shown in FIG. 2, with the first protective layer having been removed by an anisotropic etch.

FIG. 3 shows the arrangement shown in FIG. 2 after a further process step which involves removal of the first protective layer 103. The first protective layer 103 is removed in such a manner that the conductive material 105 is retained as a projection in the trench-like recess 102, spaced apart from the side walls 107 of the trench-like recess, as indicated by the hatched region in FIG. 3.

Figure 4:
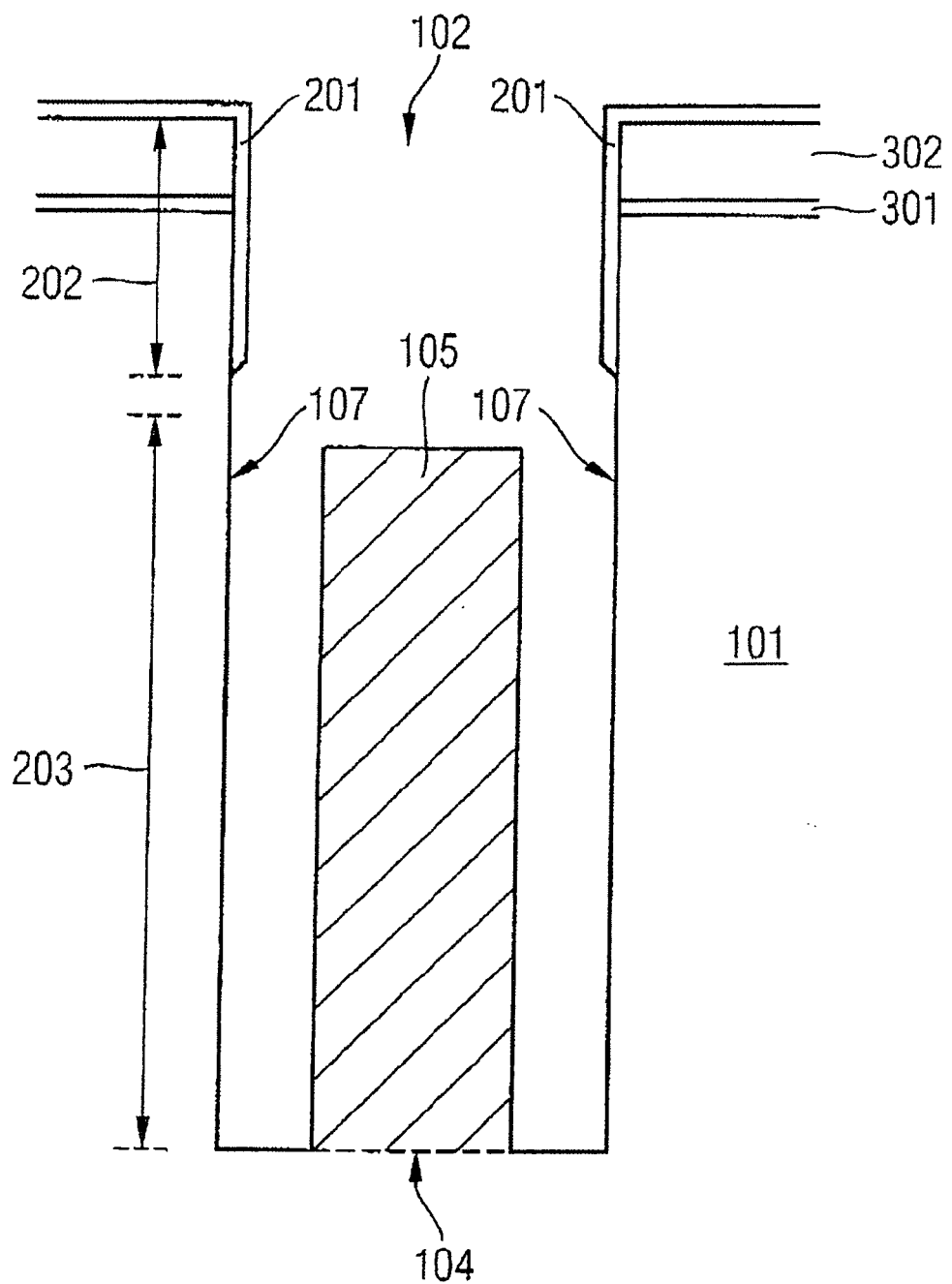
FIG. 4 shows the arrangement shown in FIG. 3, with a second protective layer having been applied in an upper region of the trench-like recess.

FIG. 4 shows the process step of depositing a second protective layer 201 in an upper region 202 of the trench-like recess 102 while a lower region 203 of the trench-like recess is not covered by the second protective layer 201. A nonconformal deposition, as it is known, of this type, for example using the ALD process, is known to the average person skilled in the art.

Following the nonconformal deposition of the second protective layer 201, this layer is annealed, for example at a temperature of from 900 to 1100° C. It is preferable for the second protective layer to be formed from aluminum oxide ($Al_2O_3$). After the second protective layer has been deposited, it is possible to produce an embedded electrode (buried plate) by means of gas phase doping in a lower region 203 of the trench-like recess, while the regions of the trench-like recess which are covered by the second protective layer 201 remain protected. Following the gas phase doping used to produce the embedded electrode, the second protective layer 201 is removed. This removal of the second protective layer 201 is carried out, for example, by means of a wet-chemical process which is selective with respect to silicon, silicon oxide ($SiO_2$) and silicon nitride ($Si_3N_4$)

FIG. 4 clearly shows that an electrode surface area of a first electrode, which is formed by the substrate 101, is considerably increased compared to a conventional memory cell in which a single trench-like recess 102 is etched, as in the processes of the prior art. The surface area of the first electrode is now formed by the sum of the surface area of the side walls 107 of the trench-like recess 102 and the surface areas of the conductive material 105 which is provided in the form of a projection in a central region of the trench-like recess 102, spaced apart from the side walls 107 of the trench-like recess 102.

Figure 5:
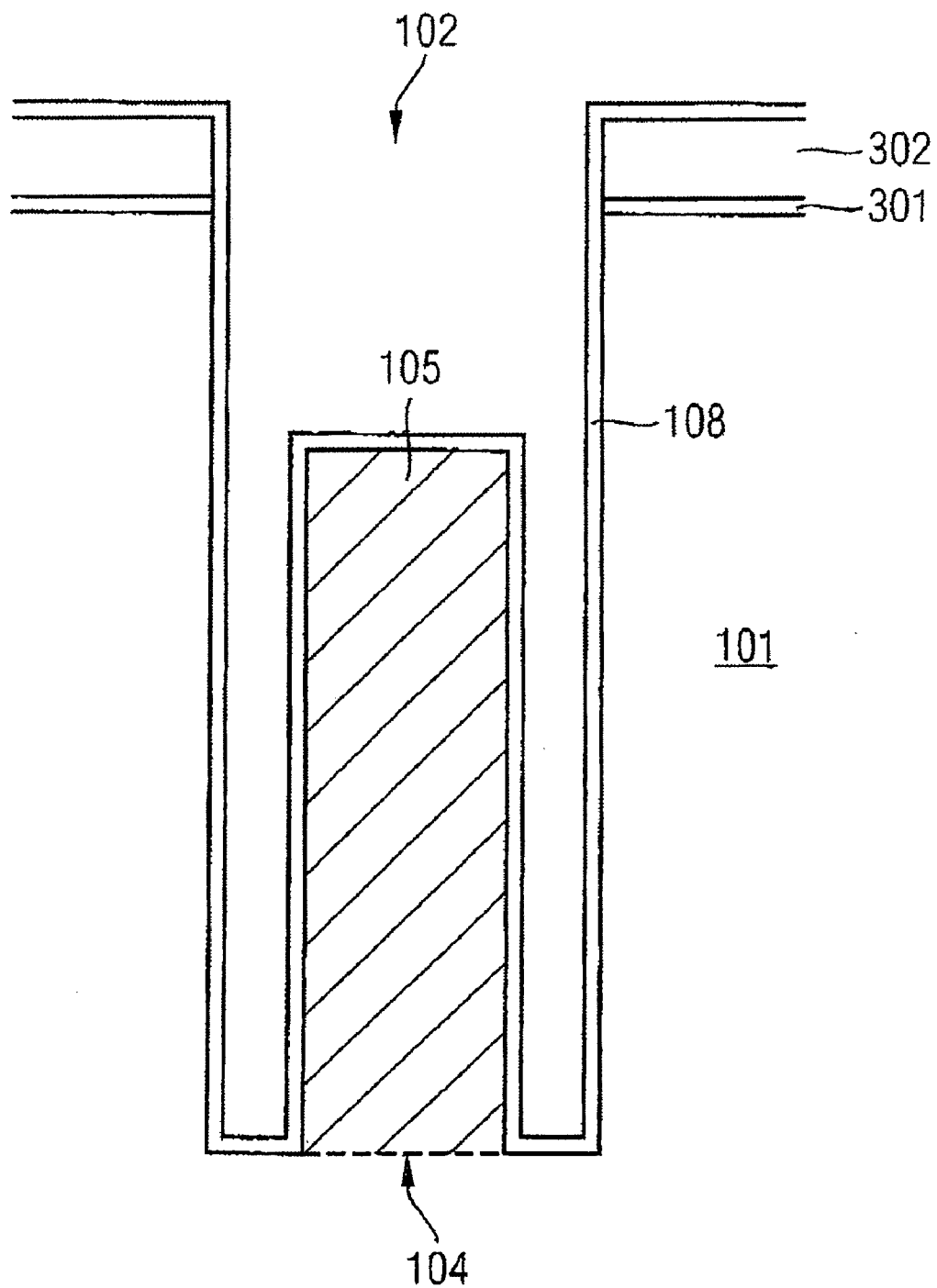
FIG. 5 shows the arrangement shown in FIG. 4, with the second protective layer having been removed and a dielectric layer having been applied to the base of the trench-like recess, the side walls of the trench-like recess, the side walls of the trench-like recess and the surfaces of the conductive material.

The process steps shown in FIGS. 5 and 6 correspond to the process steps which are also used in conventional methods for fabricating memory cells. For example, it is shown in FIG. 5 that a dielectric layer 108 has been applied as an insulating layer to the surface of the first electrode. The dielectric layer 108, as illustrated in FIG. 5, has also been deposited on the side walls 107 of the trench-like recess 102, the base 104 of the trench-like recess 102 and the surfaces of the conductive material 105.

Finally, FIG. 6 shows the process step which leads to a completed storage capacitor, namely the application of an electrode layer which forms a second electrode of the storage capacitor. To form the second electrode, the electrode layer 110 is deposited on the dielectric layer 108; as illustrated in FIG. 6, it may be advantageous to completely fill the remaining space in the trench-like recess 102 during the deposition of the electrode layer 110 on the dielectric layer 108.

In FIGS. 1 to 6, a reference numeral 301 denotes a covering layer which is formed, for example, from silicon oxide ($SiO_2$) and has been applied to the surface of the substrate 101 in order to cover the substrate. Furthermore, in FIGS. 1 to 6 a reference numeral 302 denotes a connection layer (pad nitride) which is used for the purpose of connecting the memory cell. The connection layer 302 preferably consists of silicon nitride ($Si_3N_4$).

FIG. 6 also illustrates (by means of numerical values in parentheses) the quantitative increase in capacitance.

An additional surface area compared to a "normal" trench capacitor results from the estimate presented in Equation (1)

$$\text{additional surface area} = 40 \text{ nm} \cdot \pi \cdot 4.5 \text{ µm} = 0.56 \text{ µm}^2 \quad (1)$$

Therefore, the method according to the invention for fabricating a memory cell creates a memory cell which has a capacitance that is increased by approx. 40%, since the memory cell which is created using a conventional method has a capacitance corresponding to equation (2):

$$\text{surface area of a conventional (output) memory cell} = 90 \text{ nm} \cdot \pi \cdot 4.5 \text{ µm} = 1.4 \text{ µm}^2 \quad (2)$$

Therefore, the method according to the invention for fabricating a memory cell makes it possible, despite having a reduced feature size, to provide a sufficient capacitance of the capacitor, on account of a considerable (40%) increase in surface area. The arrangement shown in FIG. 6 corresponds to a capacitor which is folded upward with dimensions typical of the 62 nm (nanometer) technology generation.

One particular advantage of the method according to the invention for fabricating a memory cell consists in the use of a carbon material for the first protective layer, since the carbon material can easily be removed again after the trench-like recess has been filled with the electrically conductive material.

Although the present invention has been described above on the basis of preferred exemplary embodiments, it is not restricted to these particular embodiments, but rather can be modified in numerous ways.

Also, the invention is not restricted to the possible applications mentioned.

List of Reference Symbols

In the figures, identical reference symbols in each case denote identical or functionally equivalent components or steps.

| | |
|---|---|
| 101 | Substrate |
| 102 | Trench-like recess (deep trench) |
| 103 | First protective layer |
| 104 | Base |
| 105 | Conductive material |
| 106 | Filling height |
| 107 | Side wall |
| 108 | Dielectric layer |
| 109 | Filling material width |
| 110 | Electrode layer |
| 201 | Second protective layer |
| 202 | Upper region of the trench-like recess |
| 203 | Lower region of the trench-like recess |
| 301 | Covering layer |
| 302 | Connection layer |
| ALD | Atomic layer deposition |

The invention claimed is:

1. Method for fabricating a memory cell, comprising the steps of:
   a) etching a trench-like recess, which has side walls and a base, into a substrate;
   b) depositing a first protective layer at the inner surfaces of the trench-like recess;
   c) etching anisotropically the first protective layer, in such a manner that the first protective layer is removed at the base of the trench-like recess but is retained at the side walls of the trench-like recess;
   d) filling the trench-like recess with an electrically conductive material in such a manner that an electrical contact is provided between the electrically conductive material and the substrate;
   e) etching isotropically back the conductive material to a predetermined filling height;
   f) removing the first protective layer in such a manner that the conductive material is retained as a projection in the trench-like recess, spaced apart from the side walls of the trench-like recess;
   g) depositing a dielectric layer on the side walls of the trench-like recess, the base of the trench-like recess and the surfaces of the conductive material; and
   h) depositing an electrode layer on the dielectric layer, in which method, prior to step g) of depositing a dielectric layer, a second protective layer is deposited nonconformally in an upper region of the trench-like recess, an embedded electrode is produced by means of gas phase doping in the trench-like recess, and the second protective layer is removed again by wet-chemical means.

2. Method according to claim 1, wherein the dielectric layer is deposited on the side walls of the trench-like recess, the base of the trench-like recess and the surfaces of the conductive material by means of atomic layer deposition.

3. Method according to claim 1 wherein the dielectric layer is annealed after it has been deposited.

4. Method according to claim 1, wherein the trench-like recess is widened in a lower region by means of a side wall etch.

5. Method according to claim 1, wherein the first protective layer is provided as a sacrificial layer of a carbon material.

6. Method according to claim 1, wherein the second protective layer is formed from an aluminum oxide material.

7. Method according to claim 1, wherein the removal of the first protective layer is carried out selectively with respect to silicon nitride and silicon oxide, in such a manner that the conductive material is retained as a projection in the trench-like recess, spaced apart from the side walls of the trench-like recess.

8. Method according to claim 1 wherein the removal of the first protective layer is carried out by dry-chemical means, by means of an isotropic etch and/or by means of an anisotropic etch.

9. Method according to claim 1, wherein during the deposition of the electrode layer on the dielectric layer the space which remains in the trench-like recess is completely filled.

* * * * *